United States Patent
Omori et al.

(10) Patent No.: US 6,917,118 B2
(45) Date of Patent: Jul. 12, 2005

(54) SEMICONDUCTOR DEVICE

(75) Inventors: Kouji Omori, Shiga (JP); Masayuki Yukawa, Kyoto (JP); Toshiyuki Nakazawa, Shiga (JP); Seishi Oida, Kyoto (JP); Takashi Ogawa, Osaka (JP); Shigeki Sakaguchi, Kyoto (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 0 days.

(21) Appl. No.: 10/689,097

(22) Filed: Oct. 21, 2003

(65) Prior Publication Data

US 2004/0089945 A1 May 13, 2004

(30) Foreign Application Priority Data

Oct. 21, 2002 (JP) ........................................ 2002-305609
Sep. 16, 2003 (JP) ........................................ 2003-322755

(51) Int. Cl.$^7$ ............................................... H01L 29/40
(52) U.S. Cl. ........................................ 257/778; 257/737
(58) Field of Search ................................. 257/772, 778, 257/737, 738

(56) References Cited

U.S. PATENT DOCUMENTS 6,334,905 B1 * 1/2002 Hanawa et al. ................ 148/23
6,784,086 B2 * 8/2004 Ray et al. ..................... 438/612

FOREIGN PATENT DOCUMENTS

JP 10-12773 A 1/1998

* cited by examiner

Primary Examiner—Roy Potter
(74) Attorney, Agent, or Firm—McDermott Will & Emery LLP (57) ABSTRACT

On a surface of an electronic component facing a substrate, a plurality of electrode terminals are provided which are of circular plane shapes. On regions of the main surface of the substrate facing the electrode terminals, a plurality of interconnect electrodes are provided which are of circular plane shapes.

8 Claims, 6 Drawing Sheets

SEMICONDUCTOR DEVICE

BACKGROUND OF THE INVENTION

The present invention relates to semiconductor devices including an electronic component of surface mount type and a substrate with the electronic component mounted thereon. In particular, the present invention relates to semiconductor devices in which an external electrode of the electronic component contains a palladium film and is joined to a tin (Sn)-zinc (Zn)-based lead-free solder material.

A semiconductor device formed of an electronic component surface-mounted on a substrate will be described below with reference to the accompanying drawings.

Figure 6A:
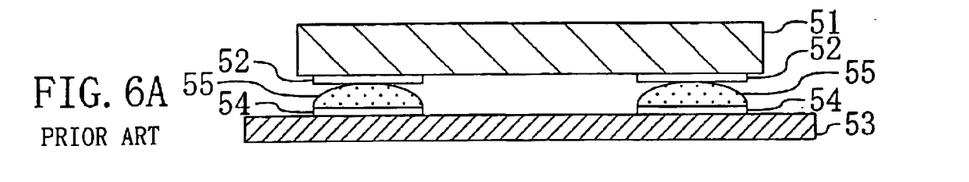
FIG. 6A is a cross-sectional view of the semiconductor device.
Figure 6B:
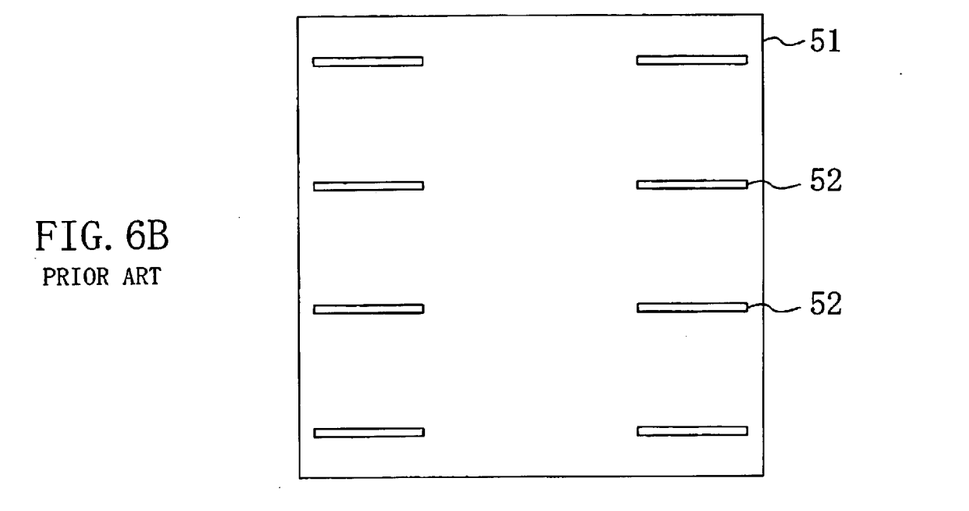
FIG. 6B is an bottom view of the electronic component.
Figure 6C:
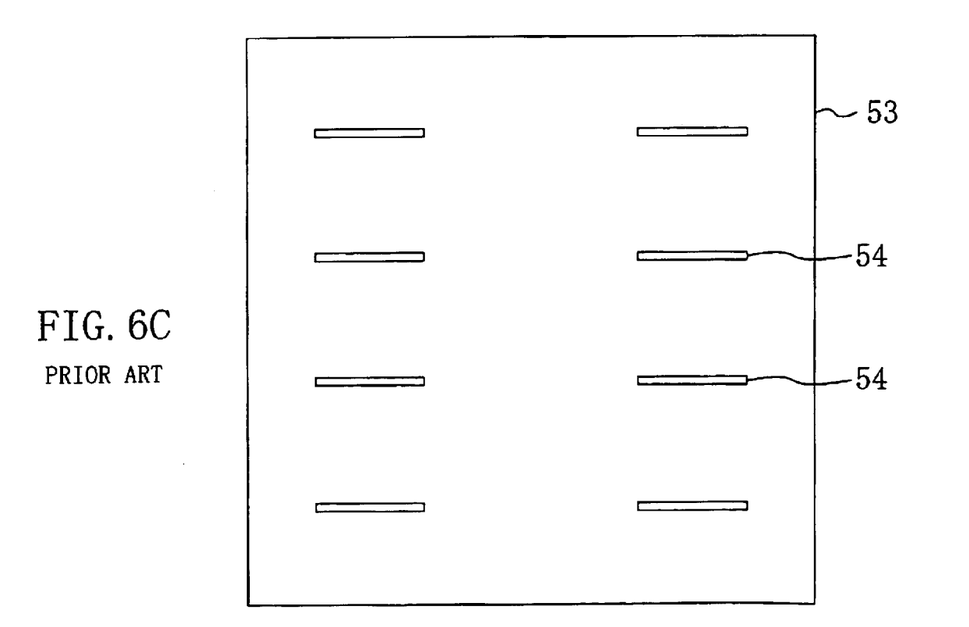
FIG. 6C is a plan view of the substrate.

FIGS. 6A to 6C illustrate a conventional semiconductor device. FIG. 6A shows a cross-sectional construction of the semiconductor device, FIG. 6B shows the underside construction of an electronic component, and FIG. 6C shows the plane construction of a substrate.

Referring to FIG. 6A, an electronic component 51 of surface mount type is mounted on the main surface of a substrate 53. On the surface of the electronic component 51 facing the substrate 53, electrode terminals 52 are formed. On the main surface of the substrate 53, interconnect electrodes 54 are formed at positions facing the electrode terminals 52 of the electronic component 51. The electrode terminals 52 adhere securely to the respective interconnect electrodes 54 with a solder material 55 so that they are electrically connected to each other.

As mentioned above, to mount the electronic component 51 of surface mount type on the substrate 53, this approach has been employed in which the interconnect electrodes 54 formed on the main surface of the substrate 53 and the electrode terminals 52 provided on the electronic component 51 are joined with a solder.

There are various plane shapes of the electrode terminals 52 depending upon the type of the electronic component 51. According to each plane shape of the electrode terminals 52, the plane shape and the plane dimension of the interconnect electrodes 54 on the substrate 53 are determined.

Taking an area array package for example, as shown in FIG. 6B, the electronic component 51 has the multiple electrode terminals 52 of rectangular plane shapes provided on the undersurface thereof. The interconnect electrodes 54 of the substrate 53, which will be joined to the electrode terminals 52 by the solder material 55, are provided in almost the same shapes as the electrode terminals 52, as shown in FIG. 6C. Therefore, in the step of mounting the electronic component 51 on the substrate 53, the solder material 55 are first placed, by printing technique or the like, on the interconnect electrodes 54 of the substrate 53 in almost the same shapes as the interconnect electrodes 54, after which a solder reflow process is performed to join the electrode terminals 52 to the interconnect electrodes 54.

Note that the interconnect electrodes 54 provided on the substrate 53 are generally formed by plating treatment or flux coating in which a copper foil is coated with nickel (Ni) and gold (Au).

As the conventional solder material 55, general use is made of a solder material of Sn—Pb eutectic crystal type. It exhibits a sufficient solder wettability even if palladium plating is applied as a surface treatment for the electrode terminals 52 provided on the electronic component 51, so that it provides good solder joint strength.

The dominating lead-free solder material containing no lead has been a tin (Sn)-silver (Ag)-based lead-free solder material, which disadvantageously has a high melting temperature and high material costs. To overcome this disadvantage, a tin (Sn)-zinc (Zn)-based lead-free solder material has recently been employed which has a low melting temperature and low material costs.

As shown in FIG. 6A, if palladium-based plating as a surface treatment for the electrode terminals 52 is applied to the electronic component 51 and the Sn—Zn-based lead-free solder material is used as the solder material 55, the Sn—Zn-based lead-free solder material has much a worse solder wettability than a conventional solder material of Sn—Pb eutectic crystal type. Moreover, the inventors have confirmed that the Sn—Zn-based lead-free solder material melted by heat does not sufficiently wet out the palladium-based plating, especially, because of its strong cohesive force.

For example, in the electronic component 51 of QFN (quad flat non-leaded package) type as shown in FIG. 6B, if the electrode terminals 52 thereof are of rectangular plane shapes and palladium-based plating is applied as the surface treatment for the electrode terminals 52, the Sn—Zn-based lead-free solder material has a good solder wettability for the interconnect electrodes 54 of the substrate 53. However, it has a poor solder wettability and exhibits a large cohesive property for the electrode terminals 52 provided on the electronic component 51, so that solder joint is formed only at a portion of each electrode terminal 52. Accordingly, good solder joint and high solder strength cannot be provided therebetween.

As described above, in the case where the solder material 55 does not wet out the electrode terminals 52, the electrode terminals 52 make insufficient electrical and mechanical connection with the interconnect electrodes 54 of the substrate 53, resulting in a decrease in the reliability of the semiconductor device.

SUMMARY OF THE INVENTION

An object of the present invention is to solve the above-mentioned conventional problems and to provide a semiconductor device in which a Sn—Zn-based lead-free solder material joins an electronic component of surface mount type with an electrode terminal coated, as a surface treatment, with palladium to an interconnect electrode provided on a substrate with the electronic component mounted thereon and in which the solder joint is ensured.

To accomplish the above object, the present invention is designed to provide a semiconductor device in which the plane shape of an electrode terminal provided on an electronic component of surface mount type is a circular shape. The circular shape is an ellipse or a circle with a ratio of the minor diameter to the major diameter of from ½ to 1 inclusive. The plane shape of the electrode terminal of another type is not a circular shape but a rectangular or square shape with a ratio of the short side to the long side of from ½ to 1 inclusive. As another type of the plane shape thereof, the corners of the rectangular shape are rounded.

The inventors conducted various studies of why solder joint is formed insufficiently on an electrode terminal coated with palladium by plating or the like in the case of using a Sn—Zn-based lead-free solder. The conclusion the inventors have reached as a consequence of these studies is as follows.

First, since flux severely degrades the Sn—Zn-based lead-free solder material, it is necessary to weaken the activity of the flux. Secondly, since palladium-based plating applied as a surface treatment for the electrode terminal has a worse solder wettability than gold plating and another plating using a meltable material, the surface of the electrode terminal is not activated sufficiently. Thirdly, since the Sn—Zn-based lead-free solder material in the molten state easily becomes spherical because of its strong cohesive force, the solder material is prevented from sufficiently wetting out the surface of the electrode terminal.

The inventors then carried out experiments in which the electronic component of surface mount type is mounted using an electrode terminal of a circular plane shape or a rectangular plane shape with a ratio of the short side to the long side of from ½ to 1 inclusive and with rounded corners. As a result of the experiments, they obtained the finding that in the case of the electrode terminal of the circular plane shape, the solder material can wet the terminal sufficiently enough to join it. This is probably because the electrode terminal of the circular plane shape or the rectangular plane shape with a ratio of the short side to the long side of from ½ to 1 inclusive and with rounded corners can be joined, in almost equal contact area, to the solder material melting and becoming spherically cohesive and therefore adequate solder wettability can be induced to provide sufficient solder joint therebetween.

The same story holds true for an interconnect electrode provided on a substrate for mounting. Consequently, both the electrode terminal provided on the electronic component of surface mount type and the interconnect electrode provided on the substrate are of circular shapes or rectangular shapes with a ratio of the short side to the long side of from ½ to 1 inclusive and with rounded corners, which reduces the concentration of stresses caused after the solder joint and provides good solder joint.

To be more specific, a semiconductor device according to the present invention comprises: an electronic component in plate form including an external electrode; and a substrate which includes, on a main surface thereof, an interconnect electrode electrically connected to the external electrode and on the main surface of which the electronic component is mounted. The external electrode and the interconnect electrode are securely adhered together with a solder material containing tin and zinc, and the plane shape of the external electrode is a circular shape, or a rectangular or square shape with a ratio of the short side to the long side of from ½ to 1 inclusive. As another type of the external electrode, the plane shape of the interconnect electrode is a rectangle whose corners are rounded.

With the semiconductor device of the present invention, in mounting the electronic component on the substrate, the heated and spherically cohesive solder material is joined, in almost equal contact area, to the external electrode, which induces adequate solder wettability to the external electrode to provide sufficient solder joint therebetween.

In the semiconductor device of the present invention, it is preferable that the plane shape of the interconnect electrode is a circular shape, an ellipse shape or a rectangular shape with a ratio of the short side to the long side of from ½ to 1 inclusive, or a rectangular shape whose corners are rounded.

In this case, the solder material preferably contains bismuth.

Preferably, in the semiconductor device of the present invention, a metal film made of palladium is formed between the external electrode and the solder material.

BRIEF DESCRIPTION OF THE DRAWINGS

FIGS. 1A to 1C show a semiconductor device of an embodiment of the present invention which includes an electronic component of surface mount type and a substrate with the electronic component mounted thereon.

FIGS. 5A to 5E are schematic views showing various shapes of the electrode terminals provided on the electronic component of surface mount type and the joint states of the electrodes to respective pieces of a solder material according to another embodiment of the present invention.

FIGS. 6A to 6C show a conventional semiconductor device including an electronic component of surface mount type and a substrate with the electronic component mounted thereon.

DETAILED DESCRIPTION OF THE PREFERRED EMBODIMENTS

An embodiment of the present invention will now be described with reference to the accompanying drawings.

Figure 1A:
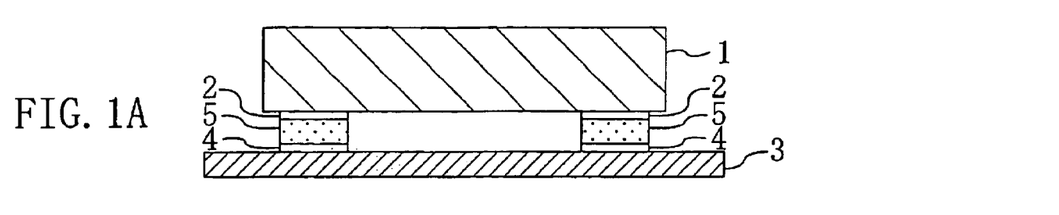
FIG. 1A is a cross-sectional view of the semiconductor device.
Figure 1B:
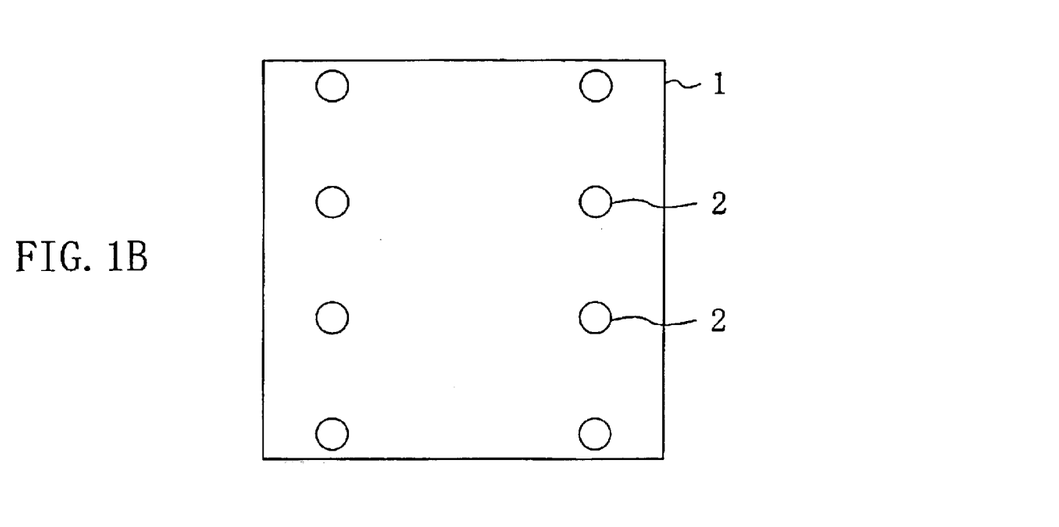
FIG. 1B is an underside view of the electronic component.
Figure 1C:
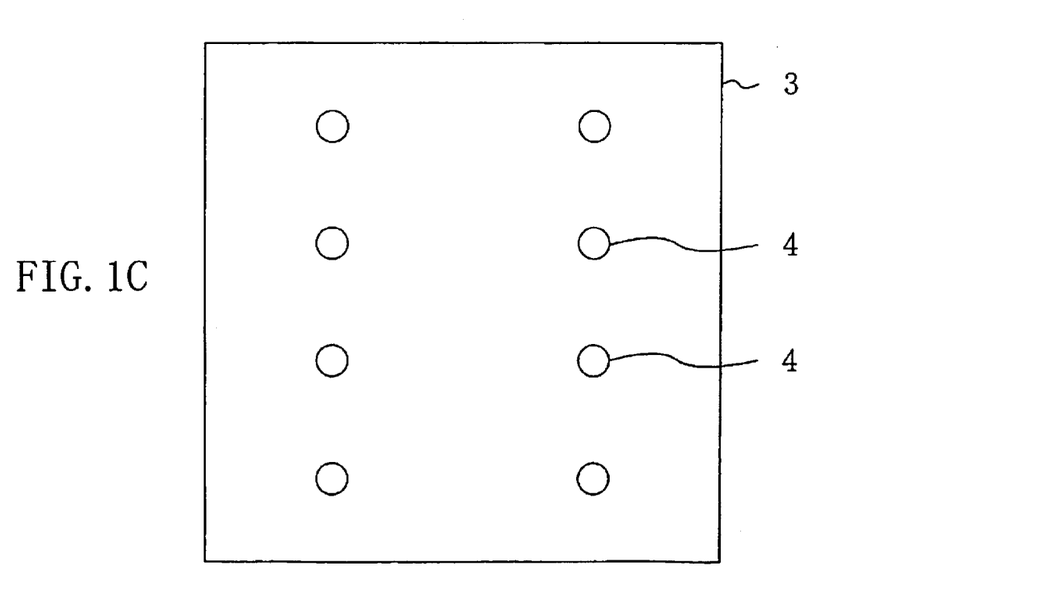
FIG. 1C is a plan view of the substrate.

FIGS. 1A to 1C show a semiconductor device according to an embodiment of the present invention which includes an electronic component of surface mount type and a substrate with the electronic component mounted thereon. FIG. 1A shows a cross-sectional construction of the semiconductor device, FIG. 1B shows the underside construction of the electronic component, and FIG. 1C shows the plane construction of the substrate.

Referring to FIG. 1A, an electronic component 1 of surface mount type is mounted on the main surface of a substrate 3. On the surface of the electronic component 1 facing the substrate 3, electrode terminals 2 are formed as external electrodes.

On the main surface of the substrate 3, interconnect electrodes 4 are formed at positions facing the electrode terminals 2 of the electronic component 1. The electrode terminals 2 adhere securely to the respective interconnect electrodes 4 with a solder material 5 (referred hereinafter to as a Sn—Zn-based lead-free solder material) so that they are electrically connected to each other. Note that an exemplary composition of the Sn—Zn-based lead-free solder material 5 is preferably zinc (Zn) of 7 to 10%, bismuth (Bi) of 0 to 3%, and tin (Sn) of the remaining amount. For example, if the composition of the Sn—Zn-based lead-free solder material 5 is zinc of 9% and tin of 91%, the eutectic point of the material 5 is 199° C. Therefore, a zinc content of the material 5 of 7 to 10% enables a decrease in melting point of the material 5. Moreover, addition of bismuth as much as about 3% thereto enables not only a decreased melting point thereof but also good wettability of the solder material. However, if bismuth more than 3% is added, the solder joint strength of the solder material probably deteriorates.

As shown in FIG. 1B, the multiple electrode terminals 2 of circular plane shapes are provided on both side portions of the electronic component 1 surface facing the substrate 3. On the other hand, as shown in FIG. 1C, the multiple interconnect electrodes 4 of circular plane surfaces are provided on regions of the main surface of the substrate 3 facing the electrode terminals 2. The interconnect electrodes 4 are formed by plating treatment or flux coating in which a copper foil is coated with nickel (Ni) and gold (Au).

Figure 2:
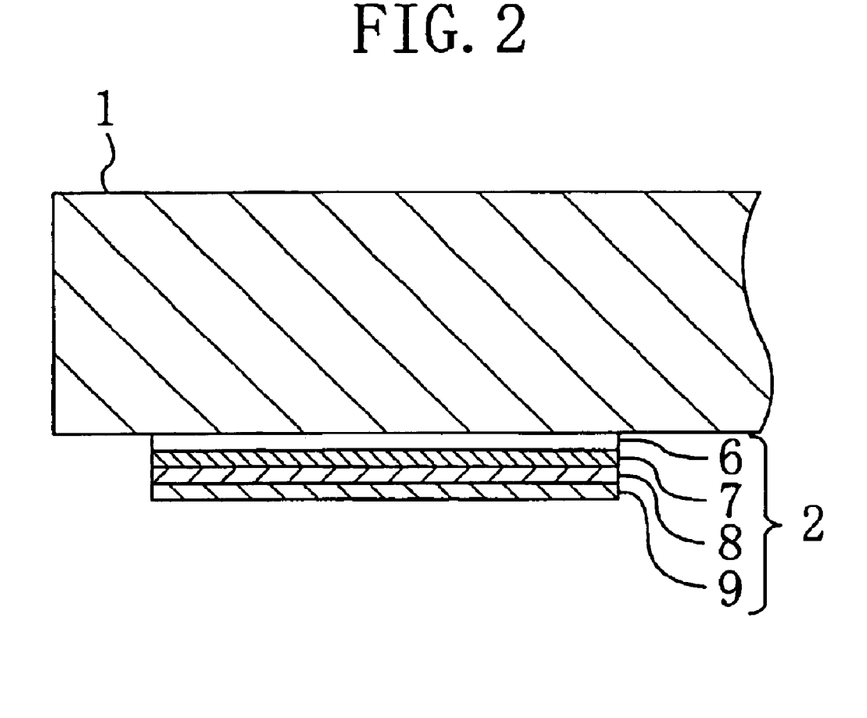
FIG. 2 is a sectional view showing the electrode terminal provided on the electronic component of the semiconductor device according to the embodiment of the present invention.

FIG. 2 shows an enlarged cross-sectional construction of the electrode terminal 2 provided on the electronic component 1 according to the present embodiment.

As shown in FIG. 2, the electrode terminal 2 is composed of a conductive base material 6 of copper (Cu), iron (Fe)-nickel (Ni)-alloy, or the like, a nickel plating 7, a palladium (Pd) plating 8 for oxidation protection, and a gold plating 9 for enhancing the wettability of a solder material, which are stacked up on the side of the electronic component 1 in the listed order.

In this construction, the thickness of the palladium plating 8 is preferably 0.005 to 0.05 $\mu$m and the thickness of the gold plating 9 is preferably 0.001 to 0.3 $\mu$m. With this construction, the palladium plating 8 and the gold plating 9 prevents oxidation of the nickel plating 7, and simultaneously tin contained in the Sn—Zn-based lead-free solder material 5 and nickel forming the electrode terminal 2 are alloyed with each other for joining.

The reason why the palladium plating 8 and the gold plating 9 are formed in this order is because gold has a higher rate of diffusion into the solder material 5 and a better anti-oxidation property than palladium. However, if the thickness of the gold plating 9 is 0.001 $\mu$m or smaller, the anti-oxidation property can hardly be expected. In contrast to this, if the thickness of the gold plating 9 is more than 0.3 $\mu$m, the strength of the solder material 5 after adhesion deteriorates. This is because formation of an alloy of gold and zinc causes deterioration of the strength of the solder material.

Next description will be made of a fabricating method of the semiconductor device thus constructed with reference to the accompanying drawings.

Figure 3A:
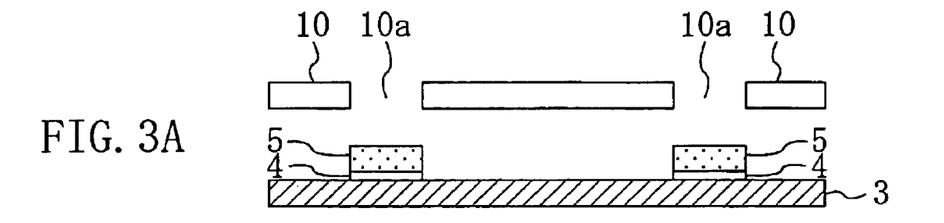
FIGS. 3A to 3C are sectional views showing process steps of a fabricating method of a semiconductor device according to the embodiment of the present invention step by step.
Figure 3B:
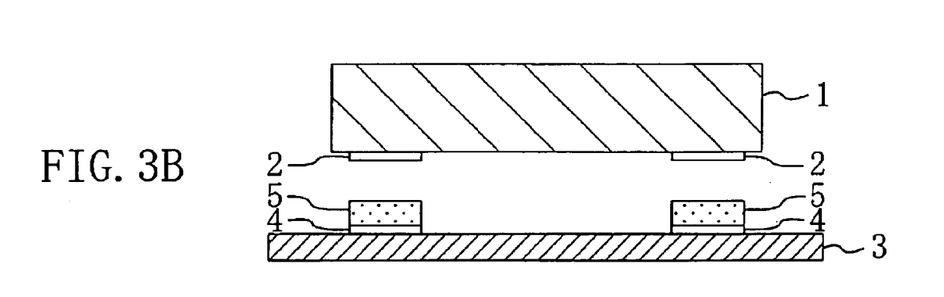
Figure 3C:
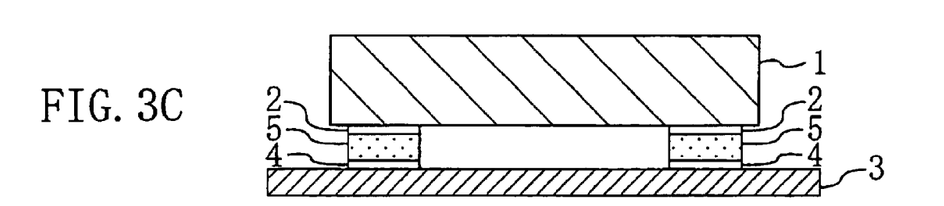

FIGS. 3A to 3C are sectional views showing process steps of a fabricating method of a semiconductor device according to the embodiment of the present invention step by step.

First, by deposition, plating or other technique, the multiple interconnect electrodes 4 are formed on regions of the main surface of the substrate 3 which face the electrode terminals 2 of the electronic component 1. As shown in FIG. 3A, using a metal mask 10 having an opening pattern 10a for exposing the interconnect electrodes 4, the Sn—Zn-based lead-free solder material 5 is applied by printing technique.

Next, as shown in FIG. 3B, pieces of the Sn—Zn-based lead-free solder material 5 applied on each interconnect electrode 4 and the respective electrode terminals 2 provided on the electronic component 1 are aligned to face each other, after which the electronic component 1 is placed on the substrate 3.

Thereafter, as shown in FIG. 3C, the substrate 3 with the electronic component 1 placed thereon is subjected to a solder reflow process to melt and solidify the Sn—Zn-based lead-free solder material 5. The solidified Sn—Zn-based lead-free solder material 5 joins the electrode terminals 2 to the respective interconnect electrodes 4. As noted above, the Sn—Zn-based lead-free solder material 5 has low activity and the palladium plating 8 forming the electrode terminals 2 has a worse solder wettability than the gold plating 9 and meltable material for plating. Therefore, in this joint, the surfaces of the electrode terminals 2 are difficult to activate. As a result, the molten Sn—Zn-based lead-free solder material 5 becomes spherical because of its strong cohesive force in the molten state, which hinders the solder material from wetting out the surface.

To solve such a problem, in the present invention, the electrode terminals 2 and the interconnect electrodes 4 are designed in circular shapes. Then, the circular electrode terminals 2 and the circular interconnect electrodes 4 are always in connection with the Sn—Zn-based lead-free solder material 5 in the molten and spherically cohesive state, which induces the solder wettability in the Sn—Zn-based lead-free solder material 5 to provide sufficient solder joints therebetween.

Moreover, the electrode terminals 2 provided on the electronic component 1 and the interconnect electrodes 4 provided on the main surface of the substrate 3 are designed in circular plane shapes, which reduces the concentration of stresses placed on the Sn—Zn-based lead-free solder material 5 after the joint. Therefore, a good and high-reliable solder joint can be provided and the joint quality of the solder joint can be stabilized in the semiconductor device.

Note that in the present embodiment the plane shapes of the electrode terminals 2 and the interconnect electrodes 4 are preferably a perfect circle or a nearly perfect circle. With this design, when the Sn—Zn-based lead-free solder material 5 is melted to be spherically cohesive, the spherically molten solder material comes into even contact with the surfaces of the electrode terminals 2 and the interconnect electrodes 4 of perfect circular plane shapes. Therefore, this design facilitates solder wettability.

In addition, in consideration of the cohesion of the Sn—Zn-based lead-free solder material 5, the diameter of each opening in the opening pattern 10a provided in the metal mask 10 may be designed about 0.1 mm greater than that of each interconnect electrode 4 of the substrate 3. With this design, when the Sn—Zn-based lead-free solder material 5 is melted to be spherically cohesive, the spherically molten solder material comes into contact with the surfaces of the electrode terminals 2 and the interconnect electrodes 4 of perfect circular plane shapes, resulting in an increase in contact area. Therefore, this design facilitates solder wettability. If the diameter of the opening in the opening pattern 10a is more than 0.1 mm greater than that of each interconnect electrode 4, however, pieces of the solder material applied on the adjacent electrode terminals 2 (interconnect electrodes 4) may adhere to each other.

As is apparent from the above, in the semiconductor device according to the present embodiment which includes the electronic component 1 of surface mount type and the substrate 3 with the component mounted thereon, the plane shapes of the electrode terminals 2 provided on the electronic component 1 and the interconnect electrodes 4 provided on the substrate 3 are both designed in circular shapes. This design provides good solder joint even when the Sn—Zn-based lead-free solder material 5 is used for the semiconductor device.

Next description with reference to the drawings will be made of another embodiment according to the present invention, in which the electrode terminals 2 and the interconnect electrodes 4 are of an elliptical plane shape or a rectangular plane shape as a different shape from the perfect circular plane shape or the nearly perfect circular plane shape.

Figure 4:
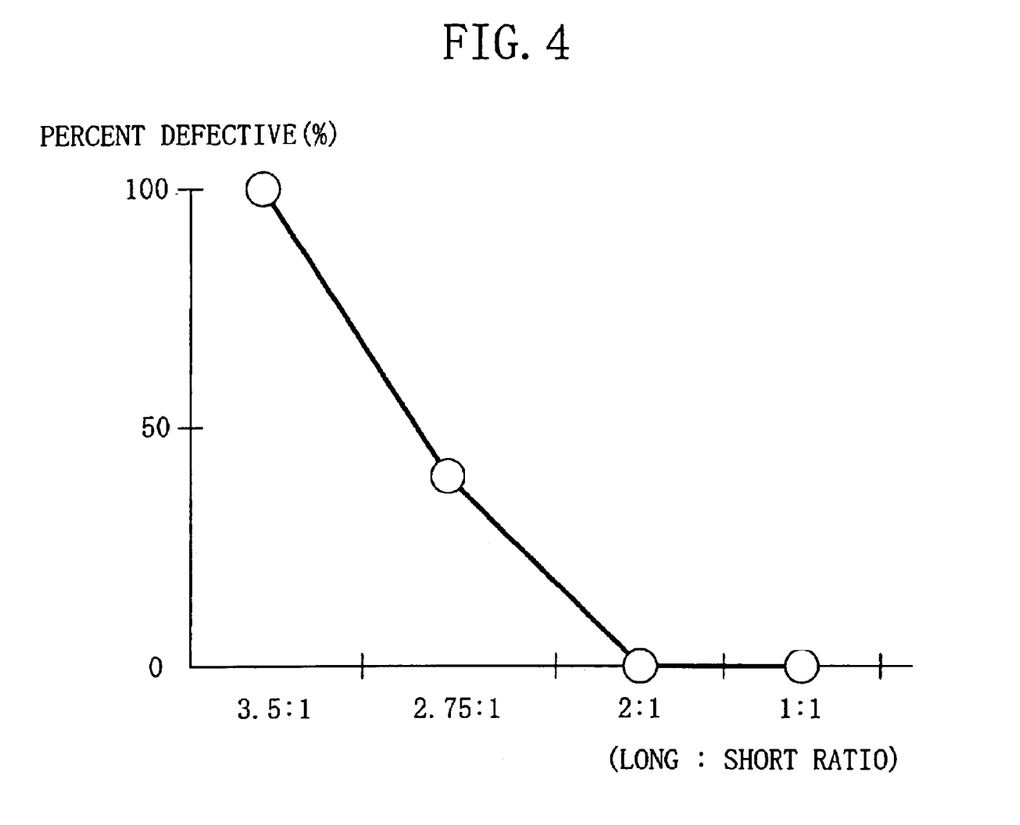
FIG. 4 is a characteristic graph of percent defective of the electronic component of surface mount type relative to the shape of the electrode terminal thereof according to the embodiment of the present invention.
Figure 5A:
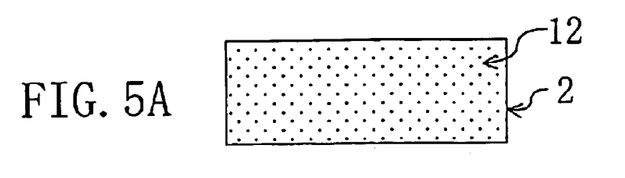
FIG. 5A shows the joint shape in the case where a conventional Sn—Pb- or Sn—Ag-based solder material is used.
Figure 5B:
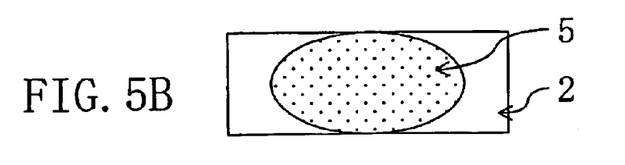
FIG. 5B shows the joint shape in the case of a high percent defective.

FIG. 4 is a characteristic graph illustrating how the percent defective of the joint between the Sn—Zn-based lead-free solder material 5 and the electrode terminals 2 varies according to the ratio of the minor diameter to the major diameter for the electrode terminal 2 of the elliptical shape, or the ratio of the short side to the long side for the electrode terminal 2 of the rectangular shape. Herein, the percent defective is defined as the percent defective, for every long:short ratio, of the shapes of the electrode terminals 2 of the electronic component 1 and the interconnect electrodes 4 of the substrate 3. The percent defective is determined by a temperature cycle test conducted after the component is mounted (one cycle is the procedure in which the test sample is kept at temperatures of −25° C. and 125° C. for 15 minutes each and after 300 cycles the electrical continuity of the sample is checked). FIG. 5 is plan views of joint conditions of the electrode terminals 2 of various shapes to the solder. For the electrode terminal 2 of the elliptical or rectangular shape with a long:short ratio of 3.5:1, use of a conventional Sn—Pb- or Sn—Ag-based solder 12 provides a percent defective of 0%, which means no problem (FIG. 5A). On the other hand, use of the Sn—Zn-based solder material 5 provides a percent defective of 100%, which bears a problem about the joint quality (FIG. 5B). However, even if the Sn—Zn-based solder material 5 is used, the electrode terminal 2 with a long:short ratio of 2.75:1 provides a percent defective of 40%. Furthermore, the electrode terminal 2 of the circular shape including the ellipse, the rectangular shape, or the square shape with a long:short ratio of 2:1 or 1:1 provides a percent defective of 0%, resulting in a stabilized joint quality. Note that in FIG. 5 each dashed line with the arrows indicates the major or minor diameter for the ellipse, and the long or short side for the rectangle.

Figure 5C:
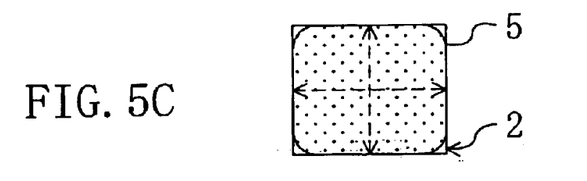
FIG. 5C shows the joint shape in the case of the terminal of a rectangular shape with a ratio of the short side to the long side of from ½ to 1 inclusive.
Figure 5D:
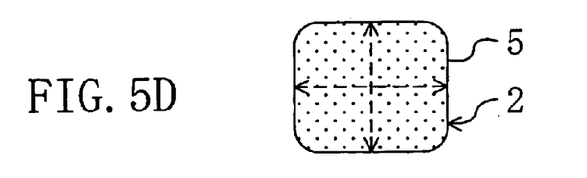
FIG. 5D shows the joint shape in the case where the corners of a rectangular terminal are rounded.
Figure 5E:
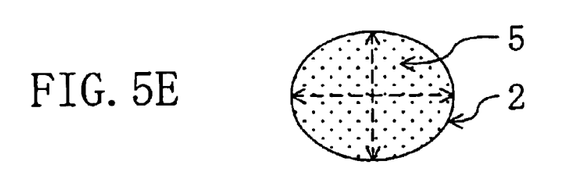
FIG. 5E shows the joint shape in the case of the terminal of a circular shape of an ellipse with a ratio of the minor diameter to the major diameter of from ½ to 1 inclusive.

FIG. 5C is a view showing the joint state of the electrode terminal 2 to the Sn—Zn-based lead-free solder material 5 according to another said embodiment of the present invention, in the case where the electrode terminal 2 is of a rectangular or square plane shape with a ratio of the short side to the long side of from ½ to 1 inclusive. These are in contact with each other apart from the corners. FIG. 5D shows the joint state in the case where the electrode terminal 2 is of a rectangular plane shape with rounded corners, and FIG. 5E shows the joint state in the case where the electrode terminal 2 is of an elliptical plane shape with a ratio of the minor diameter to the major diameter of from ½ to 1 inclusive. In these cases, the electrode terminal 2 and the Sn—Zn-based lead-free solder material 5 come into contact with each other almost evenly along the plane shape of the electrode terminal 2. The rectangular shape with rounded corners provides a better joint property than a normal rectangular shape.

In the case of the ellipse, if the ratio of the minor diameter to the major diameter is 1, the resultant ellipse is a circle. The embodiment of the present invention employs a circle or an ellipse with a ratio of the minor diameter to the major diameter of from ½ to 1 inclusive.

In this embodiment, both the plane shapes of the electrode terminals 2 provided on the electronic component 1 and the interconnect electrodes 4 provided on the substrate 3 are circular shapes, or rectangular shapes with a ratio of the short side to the long side of from ½ to 1 inclusive. The plane shape of at least the electrode terminals 2 is preferably a circular shape or a rectangular shape, more preferably a perfect circular shape. The foregoing description has been made of the case where the electrode terminals 2 of the electronic component 1 are plated with palladium. Alternatively, the case where the interconnect electrodes of the substrate are plated with palladium can also be employed in the present invention.

The present invention is useful to design and mount any component to be mounted and any mounting substrate in which a palladium-plated electrode comes into contact with a Sn—Zn-based lead-free solder material. Moreover, the present invention is useful to prevent the solder material from not fully wetting and to provide a good solder joint.

What is claimed is:

1. A semiconductor device comprising:

an electronic component in plate form including an external electrode; and a substrate which includes, on a main surface thereof, an interconnect electrode electrically connected to the external electrode and on the main surface of which the electronic component is mounted, wherein the external electrode and the interconnect electrode are securely adhered together with a solder material containing tin and zinc, and the plane shape of the external electrode is one of a circle or an ellipse with a minor-to-major diameter ratio of ½ to less than 1.

2. The device of claim 1, wherein the plane shape of the interconnect electrode is one of a circle or an ellipse with a minor-to-major diameter ratio of ½ to less than 1.

3. The device of claim 1, wherein the solder material contains bismuth.

4. The device of claim 1, wherein a metal film made of palladium is formed between the external electrode and the solder material.

5. A semiconductor device comprising:

an electronic component in plate form including an external electrode; and a substrate which includes, on a main surface thereof, an interconnect electrode electrically connected to the external electrode and on the main surface of which the electronic component is mounted, wherein the external electrode and the interconnect electrode are securely adhered together with a solder material containing tin and zinc, and the plane shape of the external electrode is a rectangular or square shape with a ratio of the short side to the long side of from ½ to 1 inclusive.

6. The device of claim 5, wherein the plane shape of the interconnect electrode is a rectangle whose corners are rounded.

7. The device of claim 5, wherein the solder material contains bismuth.

8. The device of claim 5, wherein a metal film made of palladium is formed between the external electrode and the solder material.

* * * * *